(12) United States Patent
Pantsar et al.

(10) Patent No.: US 11,921,244 B2
(45) Date of Patent: Mar. 5, 2024

(54) DETECTOR CIRCUIT

(71) Applicant: OY AJAT LTD., Espoo (FI)

(72) Inventors: Tuomas Pantsar, Espoo (FI); Jouni Pyyhtiä, Espoo (FI); Dimitrios Chatzistratis, Espoo (FI); Gerasimos Theodoratos, Espoo (FI); Yannis Glikiotis, Espoo (FI); Teemu Pitkänen, Espoo (FI)

(73) Assignee: Oy Direct Conversion Ltd., Espoo (FI)

( * ) Notice: Subject to any disclaimer, the term of this patent is extended or adjusted under 35 U.S.C. 154(b) by 140 days.

(21) Appl. No.: 17/298,539

(22) PCT Filed: Nov. 28, 2019

(86) PCT No.: PCT/FI2019/050854
§ 371 (c)(1),
(2) Date: May 28, 2021

(87) PCT Pub. No.: WO2020/109668
PCT Pub. Date: Jun. 4, 2020

(65) Prior Publication Data
US 2022/0018978 A1    Jan. 20, 2022

(30) Foreign Application Priority Data
Nov. 29, 2018 (FI) ........................... 20186017

(51) Int. Cl.
*G01T 1/24* (2006.01)
*H01L 27/146* (2006.01)
(Continued)

(52) U.S. Cl.
CPC ........ *G01T 1/247* (2013.01); *H01L 27/14659* (2013.01); *H01L 31/0272* (2013.01);
(Continued)

(58) Field of Classification Search
None
See application file for complete search history.

(56) References Cited

U.S. PATENT DOCUMENTS

| 4,684,800 A | 8/1987 | Morse et al. |
| 4,864,800 A * | 9/1989 | Banys ................ B65B 39/12 |
| | | 53/385.1 |

(Continued)

FOREIGN PATENT DOCUMENTS

| EP | 0051115 | 5/1982 |
| EP | 2703846 | 3/2014 |

(Continued)

OTHER PUBLICATIONS

PCT/FI2019/050854, Written Opinion dated Jun. 4, 2020.
(Continued)

*Primary Examiner* — Edwin C Gunberg
(74) *Attorney, Agent, or Firm* — Laurence & Phillips IP Law (57) ABSTRACT

Some embodiments include an imaging system comprising a detector substrate, at least one detector circuit comprising a capacitor coupled with the detector substrate, the capacitor arranged to collect an electrical charge from the detector substrate, and the imaging system further comprises at least one programmable current source, arranged to provide a neutralizing charge to the capacitor, and the imaging system is configured to select a value for the neutralizing charge in dependence of a frame number.

26 Claims, 8 Drawing Sheets

(51) Int. Cl.
 *H01L 31/0272* (2006.01)
 *H01L 31/028* (2006.01)
 *H01L 31/0296* (2006.01)
 *H01L 31/0304* (2006.01)

(52) U.S. Cl.
 CPC ........ *H01L 31/028* (2013.01); *H01L 31/0296* (2013.01); *H01L 31/0304* (2013.01)

(56) References Cited

U.S. PATENT DOCUMENTS

| | | | | |
|---|---|---|---|---|
| 2004/0099920 | A1* | 5/2004 | Rossi | H04N 25/63 348/E5.081 |
| 2009/0290050 | A1 | 11/2009 | Herrmann et al. | |
| 2015/0108328 | A1 | 4/2015 | Guo et al. | |
| 2015/0256765 | A1 | 9/2015 | Shafer et al. | |
| 2015/0268362 | A1* | 9/2015 | Proksa | G01T 1/24 250/370.08 |

FOREIGN PATENT DOCUMENTS

| | | |
|---|---|---|
| WO | 2004110056 | 12/2004 |
| WO | 2014091278 | 6/2014 |
| WO | 2018076220 | 5/2018 |

OTHER PUBLICATIONS

PCT/FI2019/050854, Search Report of dated Jun. 4, 2020.
PCT/FI2019/050854, International Preliminary Report on Patentability dated Jun. 1, 2021.
Kraft et al; Counting and Integrating Readout for Direct Conversion X-ray Imaging Concept, Realization and First Prototype Measurements, IEEE Nuclear Science Symposium Conference Record, 2005, ISSN 1082-3654, ISBN 0-7803-9221-3, pp. 2761-2765.

* cited by examiner

DETECTOR CIRCUIT

FIELD

The present invention relates to detectors, such as high-energy radiation or particle detectors, which may be based on semiconductor technology, for example.

BACKGROUND

Digital high-energy radiation imaging has advantages over traditional film-based imaging technology, including enabling using a smaller dose of radiation, such as X-ray or gamma radiation, and the possibility of obtaining a larger number of images.

Typically, in digital imaging a pixel array is employed, such that each pixel is configured to produce a reading of radiation intensity, the pixel values from the pixel array together forming a digital image.

In direct conversion radiation detection devices, a semiconductor detector substrate is conductively bonded to a semiconductor readout substrate. The detector substrate is made of a photo-conductor material which converts incoming radiation into electronic signals. Optimizing the performance of detector and readout substrates leads to improved digital images obtained from such substrates

SUMMARY OF THE INVENTION

According to some aspects, there is provided the subject-matter of the independent claims. Some embodiments are defined in the dependent claims.

According to a first aspect of the present invention, there is provided an imaging system comprising a detector substrate, at least one detector circuit comprising a capacitor coupled with the detector substrate, the capacitor arranged to collect an electrical charge from the detector substrate, and the imaging system further comprises at least one programmable current source, arranged to provide a neutralizing charge to the capacitor.

Various embodiments of the first aspect may comprise at least one feature from the following bulleted list:
- the detector substrate comprises a semiconductor substrate such as: a CdTe substrate, a GaAs substrate, a Si substrate, a $HgI_2$, or a Se substrate
- the at least one programmable current source is configured to provide the neutralizing charge to the capacitor separately for each pixel or group of pixels
- the imaging system is configured to select a value for the neutralizing charge in dependence of a frame number
- the imaging system is configured to select a value for the neutralizing charge in dependence of a temperature of the detector substrate
- the imaging system is configured to select a value for the neutralizing charge in dependence of at least one of: a current incident radiation dose and a cumulative incident radiation dose
- the at least one programmable current source is configured to provide the neutralizing charge during a part of a charge collection time of a frame, but not during the entire charge collection time of a frame
- the at least one programmable current source is configured to provide the neutralizing charge during at most two thirds of the charge collection time of a frame
- the at least one programmable current source is configured to provide the neutralizing charge during at most one half of the charge collection time of a frame
- the at least one programmable current source is configured to provide the neutralizing charge during at most one third of the charge collection time of a frame
- the detector circuit does not comprise a feedback loop over an amplifier
- plural detector circuits, each of the plural detector circuits comprising at least one capacitor and arranged to receive the neutralizing charge from the at least one programmable current source
- circuitry configured to generate a biasing voltage across at least part of the detector substrate
- a processing core configured to program the at least one programmable current source
- the at least one programmable current source is comprised inside the detector circuit According to a second aspect of the present invention, there is provided a method in a detector circuit, comprising collecting, in a capacitor coupled with a detector substrate of the detector circuit, an electrical charge from the detector substrate, and providing a neutralizing charge to the capacitor from at least one programmable current source.

Various embodiments of the second aspect may comprise at least one feature from the preceding bulleted list laid out in connection with the first aspect.

According to a third aspect of the present invention, there is provided a non-transitory computer readable medium having stored thereon a set of computer readable instructions that, when executed by at least one processor, cause an imaging system to at least collect, in a capacitor comprised in a detector circuit of the imaging system, an electrical charge from the detector substrate, and provide a neutralizing charge to the capacitor from at least one programmable current source.

According to a fourth aspect of the present invention, there is provided a computer program configured to cause a method in accordance with the second aspect to be performed, when run on a processor.

DETAILED DESCRIPTION

A solution is disclosed to alleviate distortion produced by a dark current in digital imaging devices. A detector substrate produces an electric current which is a sum of the photo current produced by an incoming signal, such x-rays, and dark current, which is also known as leakage current, produced by the electric field. The dark current is also produced in the detector circuit by leakage from transistors, for example. The dark current is indistinguishable from the photo current in a charge integrating system as only the total current is observed. The dark current does not contain information about input signals and it is thus desirable to remove the dark current component. The actual magnitude and polarity of the dark current may depend on at least one of the substrate material, temperature, position on the substrate material, the electric field and internal structure of the substrate. The internal structure may include crystal and other defects.

A programmable current source is provided to supply a neutralizing charge to counter an effect of the dark current and thus cause the integrated charge to substantially correspond to the photo current. In detail, it is aimed to supply from the programmable current source, or sources, a charge equal in amplitude but of opposite sign to the one produced by the dark current, to, optimally, eliminate the effect of the dark current in integrating the total charge from the pixel. While complete elimination of the effect of the dark current is aimed at, even a reduction of its effects is an improvement in functioning of an imaging device.

The programmable current source may be implemented as one or more components inside the detector circuit module, such as, for example, an application specific integrated circuit (ASIC). The programmable current source may provide one or more current sources to the detector circuits which contain switches to activate them. The programmable current source may be implemented separately for each detector circuit. Alternatively, it may be implemented as a component outside the detector circuit module. A programmable current source may be shared among one or more detector circuits having all or part of its controls shared between the respective detector circuits, that is, the programmable current source may consist of components that are detector circuit specific and components that are common to a group of detector circuits consisting of two or more detector circuits.

This provides the benefits, that the output from detector circuit reflects more accurately the actual photo current which means that its hill capacity can be used. Without the invention, a part of the capacity would be consumed by the dark current. A typical detector substrate can contain a guard ring structure to compensate for edge effects such as increased dark current on or near the edge of the substrate. While the guard ring can be useful in some cases, it can also cause issues such as curvature of the electric field at the edge of the substrate. Another benefit of the invention is that the guard ring can be eliminated or reduced in size which removes or reduces the image distortion caused by curvature of a bias electric field in the detector substrate. This allows, additionally, smaller gaps to be formed between active imaging areas of adjacent pixel arrays. This results in images with less distortion, and with smaller gaps. The detector substrate may comprise, for example, a semiconductor detector substrate.

Figure 1A:
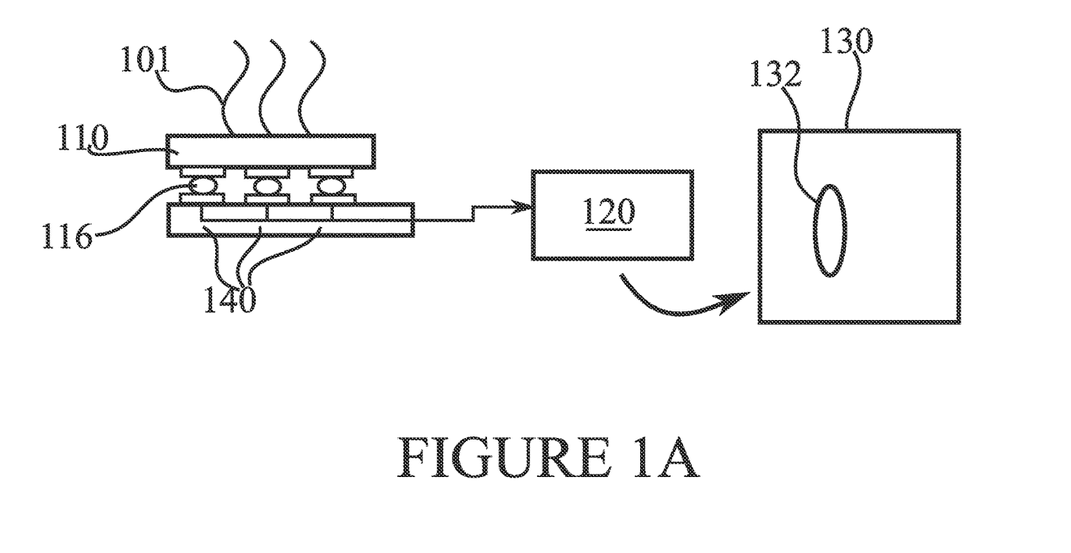
FIG. 1A illustrates an example system in accordance with at least some embodiments of the present invention.

FIG. 1A illustrates an example system in accordance with at least some embodiments of the present invention. The system of FIG. 1A is an imaging system. The imaging system may comprise an x-ray/gamma-ray imaging system, for example. The system of FIG. 1A is arranged to image radiation 101 incident on detector substrate 110 from the top. Detector substrate 110 is arranged to convert the incident radiation 101 to a plurality of electrical signals, each such signal representing a value of a pixel 116 of detector substrate 110. The electric signals are collected by detector circuits 140 and output to a processing device 120. The processing device 120 may perform, selectably, operations on information encoded in the electrical signals from detector circuit 140, to result in a digital image 130. In the example illustrated in FIG. 1A, this image comprises an image of an object 132, which may comprise a tooth, for example.

The incident radiation may be x-ray or gamma radiation, for example. Detector substrate 110 may comprise a cadmium telluride (CdTe) substrate, a gallium arsenide (GaAs) substrate, a silicon (Si) substrate, a selenium (Se) substrate or a mercury(II) iodide ($HgI_2$) substrate, for example. The operations performed in processing device 120 may comprise calibration, noise reduction, edge detection and/or contrast enhancement, for example. The imaging system may be furnished with information characterizing dark currents of the detector substrate, for example, each detector circuit 140 interfaced with detector substrate 110 may have a memory with such information relating to the pixel 116 linked to the particular detector circuit, or the information may otherwise be stored in or for detector circuit 140.

Figure 1B:
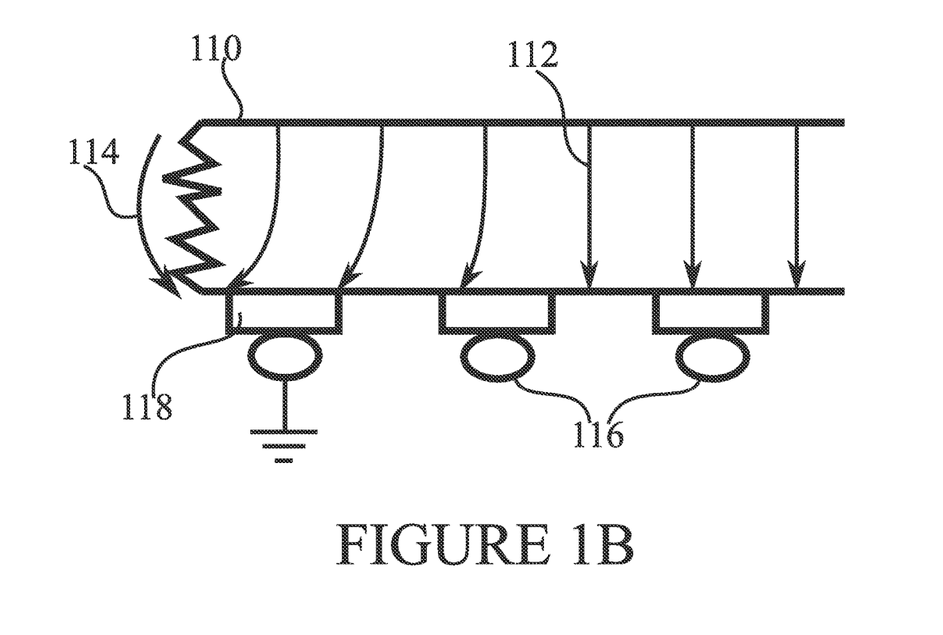
FIG. 1B illustrates a generation of a dark surface current in a detector substrate edge.

FIG. 1B illustrates a generation of a dark surface current in a detector substrate edge. Substrate 110 is viewed at its edge, which is visible as a jagged line on the left. The jagged nature of this edge may stem from production processes, which may include sawing or dicing. A bias voltage 112 is applied across the substrate, this bias voltage being 300 Volts (V) or −300 Volts, for example. As radiation quanta interact with the detector substrate, they generate charge carrier pairs which are conveyed, by the bias voltage, to pixels 116. During a charge collection time of a frame, each pixel may integrate the charges arriving therein, such that a radiation intensity in a part of detector substrate 110 corresponding to the pixel in question may be approximated from the accumulated charge. Thus the charge collection time may correspond to a time the detector is open for the incident radiation, to produce a frame of imaging data.

As a result of an interaction between the jagged edge of detector substrate and the bias voltage 112, a surface current 114 is generated across the jagged edge. This current, amounting to a type of dark current, may convey a significant charge across detector substrate 110 which may pollute one or more pixels closest to the edge. To prevent this, a guard ring 118 may be employed, to convey the dark current to ground or to another potential, as illustrated. However, this presents with the following problems in terms of producing images with such a substrate: firstly, the edge structure can cause curvature of electric field lines of the bias voltage 112, as illustrated, and secondly, the presence of the guard ring renders useless for imaging an area of the detector substrate closest to the jagged edge.

The bent field lines of bias voltage 112 cause distortion, since charge carriers generated by interaction of the incident radiation and detector substrate 112 follow the field lines. Thus some pixels 116 lose a part of the intensity they should integrate to pixels on their left, or to the guard ring 118, where the intensity is lost. Some pixels 116 close to the edge, correspondingly, receive some charge from areas of detector substrate 110 which should provide charge to pixels 116 on their right. Experimentally the bending of bias voltage 112 field lines has been detected as far as the $10^{th}$ pixel from the edge of the detector substrate 110.

The guard ring 118 increases the distance between edge-most pixels of adjacent detector substrates 110. The substrates themselves may be placed at a distance of 100 micrometres of each other, for example, and in case the guard ring displaces one pixel on each substrate, the distance between active pixels closest to the edges increases to 100 micrometres plus two pixel widths. A pixel width may be 100 micrometres, for example, whereby the guard rings would increase, in that numerology, the effective gap to 300 micrometres.

Figure 2:
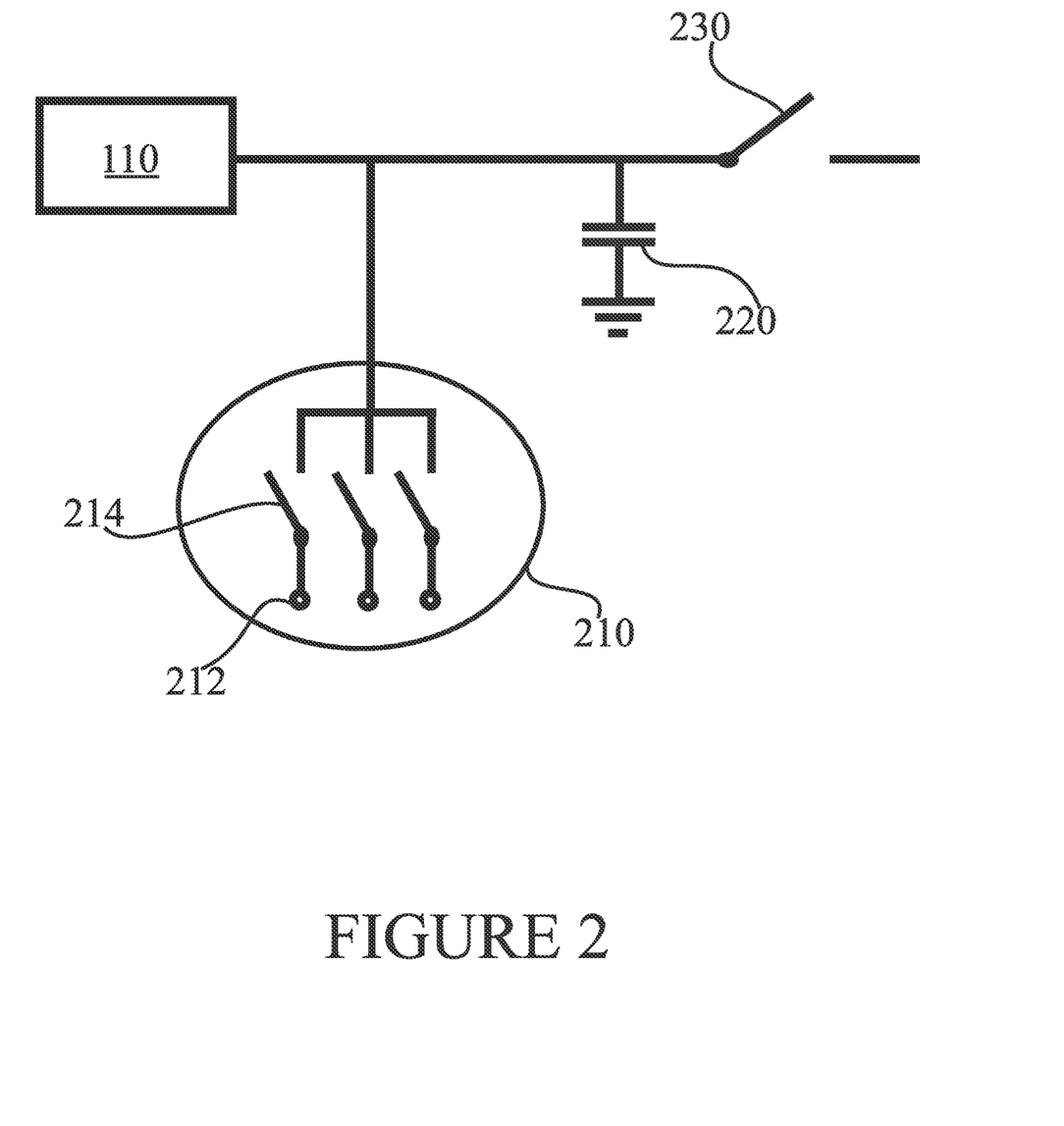
FIG. 2 illustrated use of a programmable current source in a detector circuit in accordance with at least some embodiments of the present invention.

FIG. 2 illustrates use of a programmable current source in a detector circuit in accordance with at least some embodiments of the present invention. Detector substrate 110 illustrated in FIG. 2 corresponds to that part of the substrate which conveys its charge carriers to the detector circuit illustrated. A detector circuit may alternatively be referred to as a pixel circuit. A detector substrate interface enables connection of the detector circuit to detector substrate 110. In general, a detector circuit may comprise a detector substrate interface, a capacitor 220 and at least one programmable current source 210. The detector circuit may contain additional components not illustrated in FIG. 2. In some embodiments, detector circuits comprise plural capacitors.

In general, not only limited to FIG. 2, a detector circuit may be an application specific integrated circuit, an electric circuit made of discrete components or a combination thereof. Examples of suitable application specific integrated circuit technologies include complementary metal-oxide-semiconductor (CMOS), bipolar CMOS (Bi-CMOS), metal-oxide-semiconductor (MOS) and n-channel MOS (NMOS).

In use, during the charge collection time of a frame, charge is received from detector substrate 110 to the detector circuit and accumulated into capacitor 220, where the charge is stored for readout. The readout takes place at the close of the charge collection time of the frame, via switch 230. Once the magnitude of the accumulated charge has been read out, the capacitor may be emptied in preparation for a subsequent frame.

In addition to charge generated from interaction of the incident radiation with the detector substrate, that is, by the photo current, charge may arrive in the detector circuit due to a dark current. A dark current may have its origin in the finite resistivity of the substrate which produces a current when an electric field is applied, that is, the ohmic current according to Ohm's law, the jagged edge of FIG. 1B, or in crystal electrode defects in the detector substrate in an area associated with the detector circuit. That is, dark current is present also elsewhere than at the edge of the detector substrate. Examples of crystal electrode defects include point defects, such as vacancy defects and interstitial defects, and line defects, such as dislocations and disclinations. Obtaining a so-called dark frame can provide information of dark currents for each pixel, providing information of the defects and a magnitude of the surface current for the particular detector substrate.

To counteract effects of the dark current, the illustrated detector circuit is provided with at least one programmable current source, 210. In the example illustrated in FIG. 2, three current sources 212 are present, however the number of such current sources depends on the embodiment and technical requirements of the embodiment. Thus there may be one, two, three or indeed another number of such programmable current sources.

Using the information of dark current prevailing relating to this pixel, during the charge collection time, the programmable current source(s) may be configured to provide a charge to capacitor 220 which counters, at least in part, the effect of the dark current. For example, if it is known the dark current will carry a charge or +Q_dark to capacitor 220 during the charge collection time, the at least one programmable current source may be programmed to provide a charge of −Q_dark during the charge collection time. The neutralizing charge need not be exactly the same as the charge carried by the dark current, for example if the neutralizing charge is −0.8*Q_dark, the effects of the dark current are already substantially alleviated. The information of dark current relating to this pixel may characterize the dark current as a function of frame number, as described below in connection with FIG. 3, specifically for this pixel of the detector substrate. Temperature of the substrate may also affect the magnitude of the dark current. In use, this information may be used in programming the at least one programmable current source to provide a correct neutralizing charge to capacitor 220 for each frame.

Note, that while the dark current may continue for the entire charge collection time, the neutralizing charge from the programmable current source(s) may be provided during a part only of the charge collection time, for example, during two thirds, a half, or one third, of the charge collection time. This may make it easier to match a small charge carried by the dark current, since programmable current sources may not be easy to construct such that they provide a very small constant current. An example of a current generated by a current source is 50 pA. Capacitor 220 is used accumulatively, in other words, the success of reducing the effect of the dark current substantially depends on the total accumulated charge at the end of the charge collection time and not on the temporal behavior during the charge collection time. Whether the neutralizing charge is negative or positive in sign depends on the material detector substrate 110 is comprised of.

The current sources 212 may be programmable in the sense that they are switchable via switches 214, for example. Where plural current sources 212 are provided, they may provide currents of different magnitude, such that a selectable overall charge may be provided from them to capacitor 220 by programming switches 214 accordingly to the conducting state for suitably selected lengths of time. Where a single current source 212 is provided, the charge it provides may likewise be selectable by choosing a length of time, occurring during the charge collection time of the frame, when the switch 214 is in the conducting state before being switched back to the non-conducting state.

By neutralizing the charge of the dark current, the possible guard ring may be dispensed with. Another benefit is obtained in that the bias voltage field lines 112 may be straightened, which reduces distortion in the imaging device. Furthermore, a pixel may be placed at the edge of detector substrate 110, which significantly reduces the effective gap between active areas of two adjacent detector substrates. Even further, it has been observed that the dark current changes from frame to frame, and by using a programmable current source arrangement as in FIG. 2, the detector circuits of an imaging system may adapt to this temporal development of the dark current, to enable more precise cancelling of the effects of the dark current.

In some embodiments of the invention, the programmable current source(s) are provided only at the edge of a detector substrate, for example at the row of pixels nearest the edge, or at the two rows of pixels nearest the edge or 5 or even 10 rows nearest to the edge. In general, where the programmable current source(s) are provided at the edge only, there is a region of pixels at the centre of the detector substrate which do not have the programmable current source(s). This is useful in terms of production efficiency, as the dark current and its effects can be more pronounced at the edge. On the other hand, if also crystal electrode defects are addressed by providing the programmable current source(s) to pixels throughout the detector substrate, results of the imaging will be enhanced further.

In some embodiments of the invention, the used neutralizing charge is larger near the edge of the detector substrate, and smaller in central regions of the detector substrate. In central regions, the neutralizing charge is aimed at reducing the effects of ohmic dark current and dark current generated from crystal electrode detects, while at the edge the primary use of the neutralizing charge is to reduce the effect of the surface current, which is a larger effect.

In addition to the illustrated elements, a detector circuit in accordance with the present invention may comprise, or be run with, memory and at least one processor or processing core. The memory and at least one processor core can either be inside the detector circuit; outside it in a separate component; split between the detector circuit and an external component; or in both. The memory may store information enabling the neutralizing charge to be defined for each pixel and frame number. The processing core may be configured to program the programmable current source(s) accordingly to provide the correct neutralizing charge for each frame and for each pixel. A processing core may be disposed in a processor, microcontroller or other suitable integrated circuit.

The processing core may be comprised in a processor, which may comprise, for example, a single- or multi-core processor wherein a single-core processor comprises one processing core and a multi-core processor comprises more than one processing core. The processor may comprise, in general, a control device. The processor may comprise more than one processor. The processor may be a control device. A processing core may comprise, for example, a Cortex-A8 processing core designed by ARM Holdings or a Steamroller processing core produced by Advanced Micro Devices Corporation. The processor may comprise at least one Qualcomm Snapdragon and/or Intel Atom processor. The processor may comprise at least one application-specific integrated circuit, ASIC. The processor may comprise at least one field-programmable gate array, FPGA, or microcontroller. The processor may be means for performing method steps in the imaging system. The processor may be configured, at least in part by computer instructions, to perform actions.

In some embodiments, one, two or more temperature sensors may be provided to measure a temperature of detector substrate 110. In some embodiments, a temperature of detector substrate 110 may be measured in more than one location on the detector substrate. The neutralizing charge for a specific pixel may be selected based on the frame number and a temperature of detector substrate 110.

The one or more connections from the detector substrate 110 to the capacitor 220 may comprise a metal trace on a substrate, a metal lead, a metal bump bond, a conductive adhesive or a combination thereof. The metal used may be Copper (Cu), Aluminum (Al), Gold (Au), Silver (Ag), Indium (In), Tin (Sn), Bismuth (Bi), Lead (Pb) and alloys thereof. For example, the metal may be a Copper alloy comprising Copper and at least one further metal.

In some systems, detector circuits are constructed to comprise a feedback loop over an amplifier. However, using at least one programmable current source in accordance with embodiments of the present invention, a feedback loop over an amplifier is not needed in reducing an effect of dark current.

Figure 3:
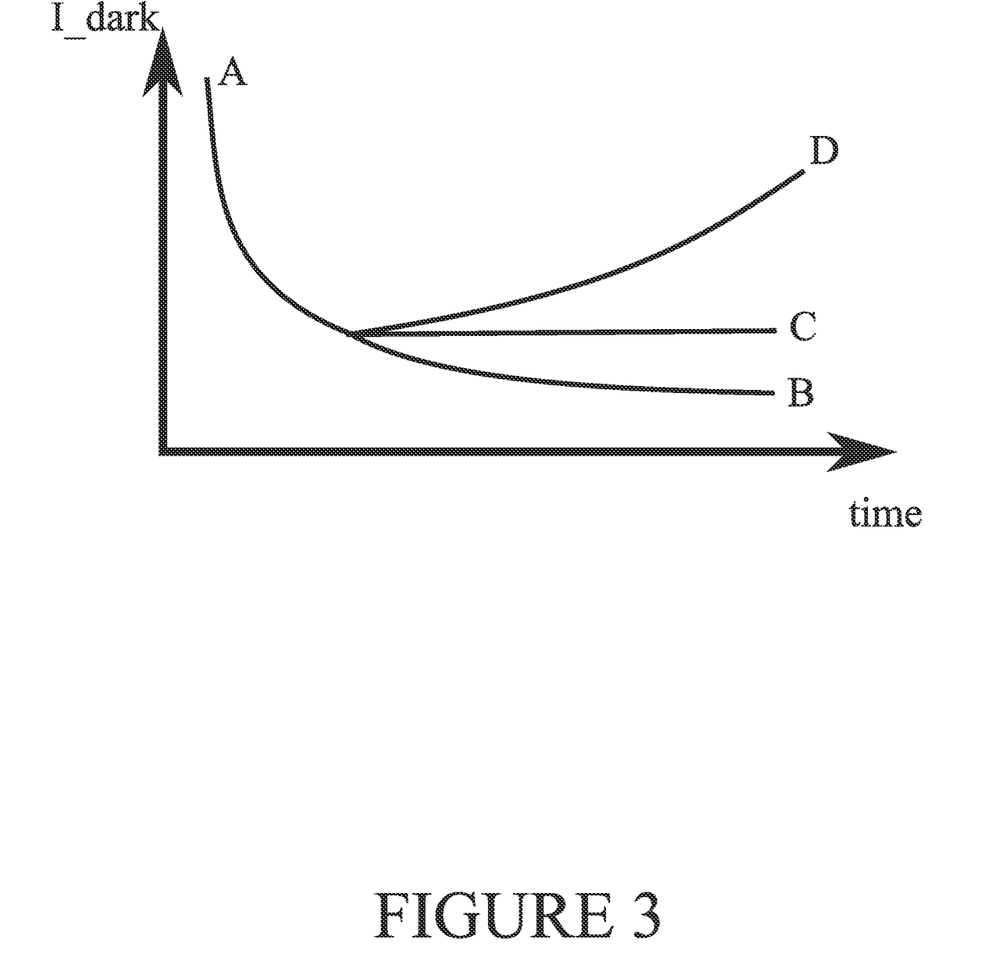
FIG. 3 illustrates examples of dependence of a dark current on time, for example frame number.

FIG. 3 illustrates examples of dependence of a dark current on time, for example frame number. The vertical axis corresponds to the dark current, for example in terms of a charge carried by the dark current during the charge collection time of a single frame. The horizontal axis corresponds to time, for example in terms of frame number.

Once imaging begins, phase A, and frames are captured, the dark current trends downward. Experimental experience is that depending on the system being used, the dark current may continue to trend monotonously downward, option B. Alternatively, at some point the dark current may stabilize and remain substantially constant from frame to frame, which is illustrated in option C. Finally, sometimes it occurs that after initially trending downward, the dark current at some point begins once more to increase, option D.

Knowing the behaviour of the dark current is thus useful for neutralizing, at least partly, its effects. As a calibration procedure, a detector substrate may be run with no incident radiation, to record characteristics of the dark current. The resulting information, known as a dark frame, may characterize the dark current as a function of frame number, separately for each pixel of the detector system. Subsequently, in use, this information may be used in programming the at least one programmable current source to provide a correct neutralizing charge to capacitor 220.

In general, the behaviour of the dark current may further depend on temperature of the detector substrate. As such, the calibration procedure may be run separately at different temperatures, to enable choosing a correct neutralizing charge for each pixel also in dependence of temperature.

Furthermore, a current incident radiation dose, as well as, optionally, a cumulative incident radiation dose may affect the dark currents in the detector substrate, wherefore the calibration process may further be run with differing, known, levels of incident radiation.

Taken together, it is thus possible that the neutralizing charge is selected, separately for each pixel or group of pixels, depending on the embodiment, in dependence of the frame number, a combination of frame number and temperature, a combination of frame number, temperature and incident instantaneous radiation, a combination of frame number, temperature and cumulative incident radiation, or a combination of frame number, temperature, incident instantaneous radiation and cumulative incident radiation.

Figure 4:
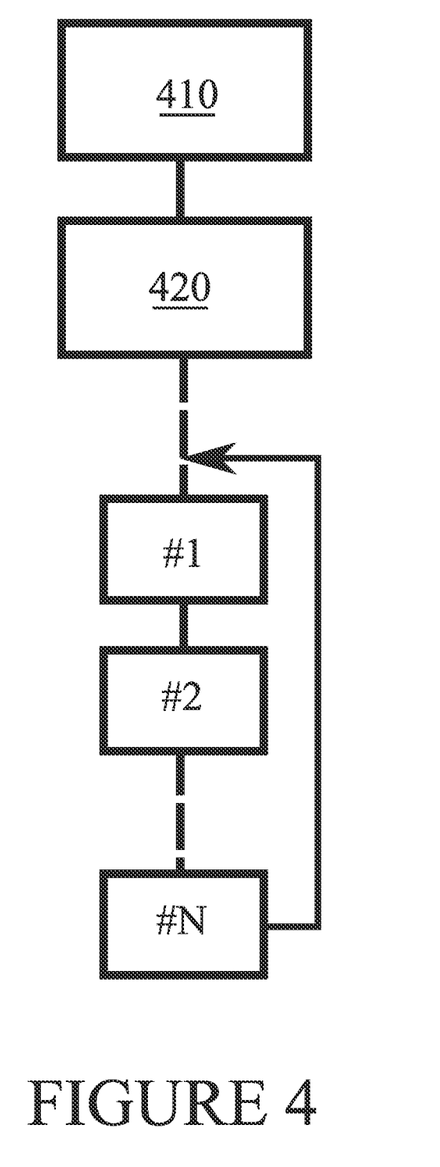
FIG. 4 illustrates an example process in accordance with at least some embodiments of the present invention.

FIG. 4 illustrates an example process in accordance with at least some embodiments of the present invention. In phase 410, dark frames are obtained from a detector system comprising a detector substrate. The dark frames characterize behaviour of dark currents in the detector substrate, including the surface current at the edge, and dark currents caused by crystal electrode defects. A series, or plural series, of dark frames may be obtained, to obtain knowledge of the behaviour of the dark currents, separately for each pixel or group of pixels, as a function of frame number in a sequence of frames and, optionally, also temperature and/or radiation as described above. Alternatively, a single dark frame is obtained.

In phase 420, the detector system is furnished with the information obtained from phase 410. This may take place prior to the detector system being released from production, as a calibration step. In detail, information characterising the amount of charge carried by the dark currents may be stored in the imaging system, separately for each pixel or group of pixels and frame number.

After phase 420, the detector system is released from production and, ultimately, it is eventually used to capture a sequence of N frames #1, #2, . . . , #N to image an object, for example. In these frames, the at least one programmable current source in each detector circuit is configured to provide a neutralizing charge to the capacitor of that detector circuit, to offset the effect of charge carried by dark current(s) for that pixel and frame. As discussed above, in addition to the pixel and frame, the correct neutralizing current may be selected further in dependence of detector substrate temperature, and/or instantaneous and/or cumulative incident radiation dose. Once a sequence of N frames is captured, the detector system may be used for another sequence at a later time. The dark frames may be collected when there is no incident radiation to the detector substrate which may take place before, after, between or during the sequences. The dark frames may also be indirectly collected by collecting frame with a known level of radiation and by inversely calculating the dark current value before, after, between or during the sequences.

Figure 5:
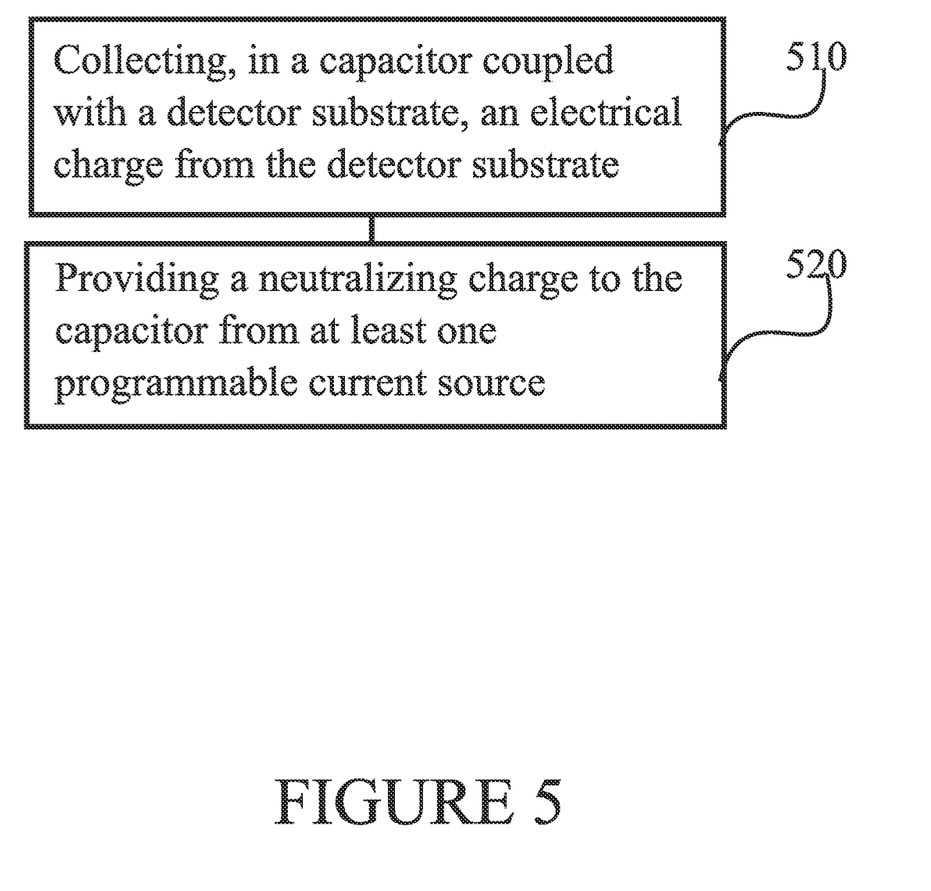
FIG. 5 is a flow graph of a method in accordance with at least some embodiments of the present invention.

FIG. 5 is a flow graph of a method in a detector circuit in accordance with at least some embodiments of the present invention. The phases of the illustrated method may be performed in a detector system, or in a control device configured to control the functioning thereof, when installed therein.

Phase 510 comprises collecting, in a capacitor coupled with a detector substrate of the detector circuit, an electrical charge from the detector substrate. Phase 520 comprises providing a neutralizing charge to the capacitor from at least one programmable current source. A size of the neutralizing charge may be selected based on a frame number associated with the collecting. The size of the neutralizing charge may be separately selected based on the frame number in each of the detector circuits of the detector system. The size of the neutralizing charge may further depend on the current detector substrate temperature, and current incident radiation dose. In some embodiments, a cumulative incident radiation dose is further taken into account in selecting the correct neutralizing charge from a pre-stored table. The pre-stored table may be generated in a calibration process by running the detector substrate for plural sequences of frames, in different temperatures, and subject to differing levels of incident radiation.

Taken together, it is thus possible that the neutralizing charge is selected, separately for each pixel or group of pixels, depending on the embodiment, in dependence of the frame number, a combination of frame number and temperature, a combination of frame number, temperature and incident instantaneous radiation, a combination of frame number, temperature and cumulative incident radiation, or a combination of frame number, temperature, incident instantaneous radiation and cumulative incident radiation. The selecting may be based on a mapping from an input set to a set of neutralizing charge values. For example, where the neutralizing charge is selected based on a frame number and temperature, the mapping will take the frame number and current temperature as inputs, and produce a neutralizing charge value for the pixel or group of pixels as output. As another example, where the neutralizing charge is selected based on a frame number, temperature and incident instantaneous radiation, the mapping will take the frame number, current temperature and current incident instantaneous radiation as inputs, and produce a neutralizing charge value for the pixel or group of pixels as output. While mapping and/or using look-up tables is illustrated as a mechanism for generating neutralizing charge values, in other examples, relationships and/or formulas may be generated based on the detector substrate's dark current characteristics and the neutralizing charge values can be calculated based on frame number, temperature, incident instantaneous radiation, and/or cumulative incident radiation inputs to those relationships and/or formulas. In other examples, mapping may be combined with relationships and/or formulas to generate the neutralizing charge values, or the intermediate neutralizing charge values can be calculated from previously mapped values. The temperature may be obtained, for example, from suitably installed temperature sensors or additionally by estimating if from the measured dark current from a previously acquired dark current vs. temperature look-up tables of functions. The instantaneous incident radiation may be determined based on an amplitude of output from the detector system, for example. The cumulative incident radiation may be determined based on an integrated value of the instantaneous incident radiation, for example. The mapping may be established using dark frames, as described above in connection with FIG. 4.

Referring back to FIG. 4, phase 410 may take place as part of manufacturing and/or initial calibration of the apparatus before releasing the detector system from production to use, or before taking the detector system into use, or during periodic re-calibration of the detector system, for example. As one example, periodic re-calibrations may be conducted to account for drifts in the behaviour of the dark currents, wherefore these re-calibrations may be performed by recording less data than initial calibration in connection with manufacture of the detector system, for example.

As described earlier, the neutralizing charge need not be an identical opposite-sign value as the charge carried by the dark current (e.g., $-Q\_dark$), but the amplitude of the used neutralizing charge may be a fraction of the amplitude of the dark current. In an embodiment, the amplitude of the neutralizing charge may be 0.5 to 1.5 times the amplitude of the charge carried by the dark current (e.g., $-0.5*Q\_dark$, <neutralizing charge<$-1.5*Q\_dark$). In another example, the amplitude of neutralizing charge may be 0.8 to 1.2 times the amplitude of the charge carried by the dark current (e.g., $-0.8*Q\_dark$,<neutralizing charge<$-1.2*Q\_dark$). Further, the amplitude of the neutralizing charge may be between 0.9 to 1.1 times the amplitude of the charge carried by the dark current, or 0.7 to 1.3 times the amplitude of the charge carried by the dark current.

Figure 6A:
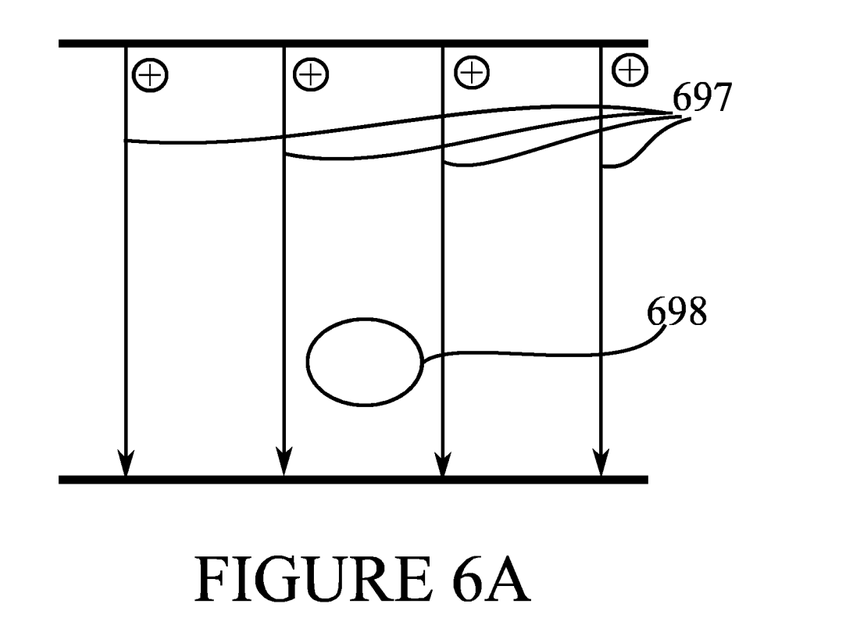
FIG. 6A illustrates an initial generation of pixel charge distribution in a detector.
Figure 6B:
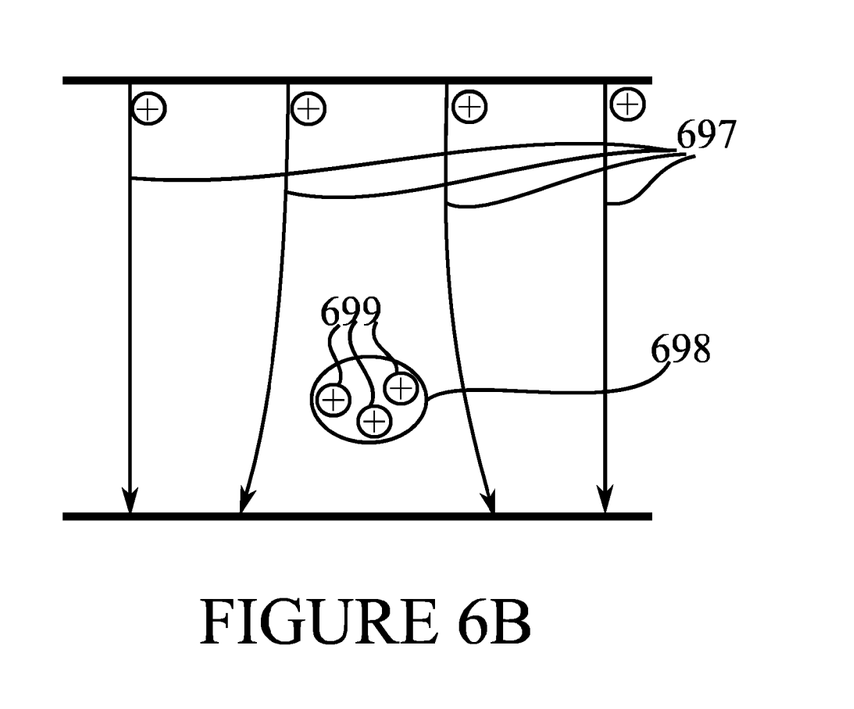
FIG. 6B illustrates a generation of pixel charge distribution in a detector after some operating time.

FIGS. 6A and 6B illustrate reasons for the different behaviours of dark current as a function of frame number, illustrated in FIG. 3. FIG. 6 illustrate a contributing reason to for the dark current occurrence of option B (shown in FIG. 3) for some pixels and option D (shown in FIG. 3) for other pixels in the later frames. In detail, the behaviour can be caused, at least in part, by charge trapping inside the detector substrate, such as CdTe, as trap centres. These trap centres may start deflecting the electric field from a linear configuration, wherefore some pixels will start experiencing the dark current from their neighbouring pixels while other pixels will receive less dark current. The charge trapping may especially concern positive charges due to lower drift speed. While FIGS. 6A and 6B are drawn with a CdTe substrate as an example, other materials may experience similar effects. Starting at FIG. 6A, the electric field is linear, that is, its field lines 697 proceed as straight lines through the substrate. A defect 698 is disposed in the substrate, the defect being due to an inherent crystal defect, for example. Initially the substrate is depleted of charge carriers and the defect has an electrical charge of zero. In use, proceeding to FIG. 6B, charges 699 are accumulated in defect 698, causing a local electric charge which modifies the electric field near defect 698. As the field lines 697 are bent, the progression of dark current is modified and the charge carried by the dark current is re-distributed among pixels such that some pixels receive more, and other pixels less, of this charge than before the accumulation of the charge 699.

As shown in FIG. 2, the programmable current source may be located within the detector circuit. In other embodiments (not shown), the programmable current source may be outside the detector circuit but share the same ASIC with the detector circuit. In other embodiments (not shown), the programmable current source may be outside the detector circuit and outside ASIC including the detector circuit. The ASIC may also perform pixel read-out functions in the detector system, for example. In other embodiments (not shown), the programmable current source may include features inside detector circuit, such as switches, and other features outside the detector circuit but on the same ASIC with the detector circuit, such as current sources.

Figure 7:
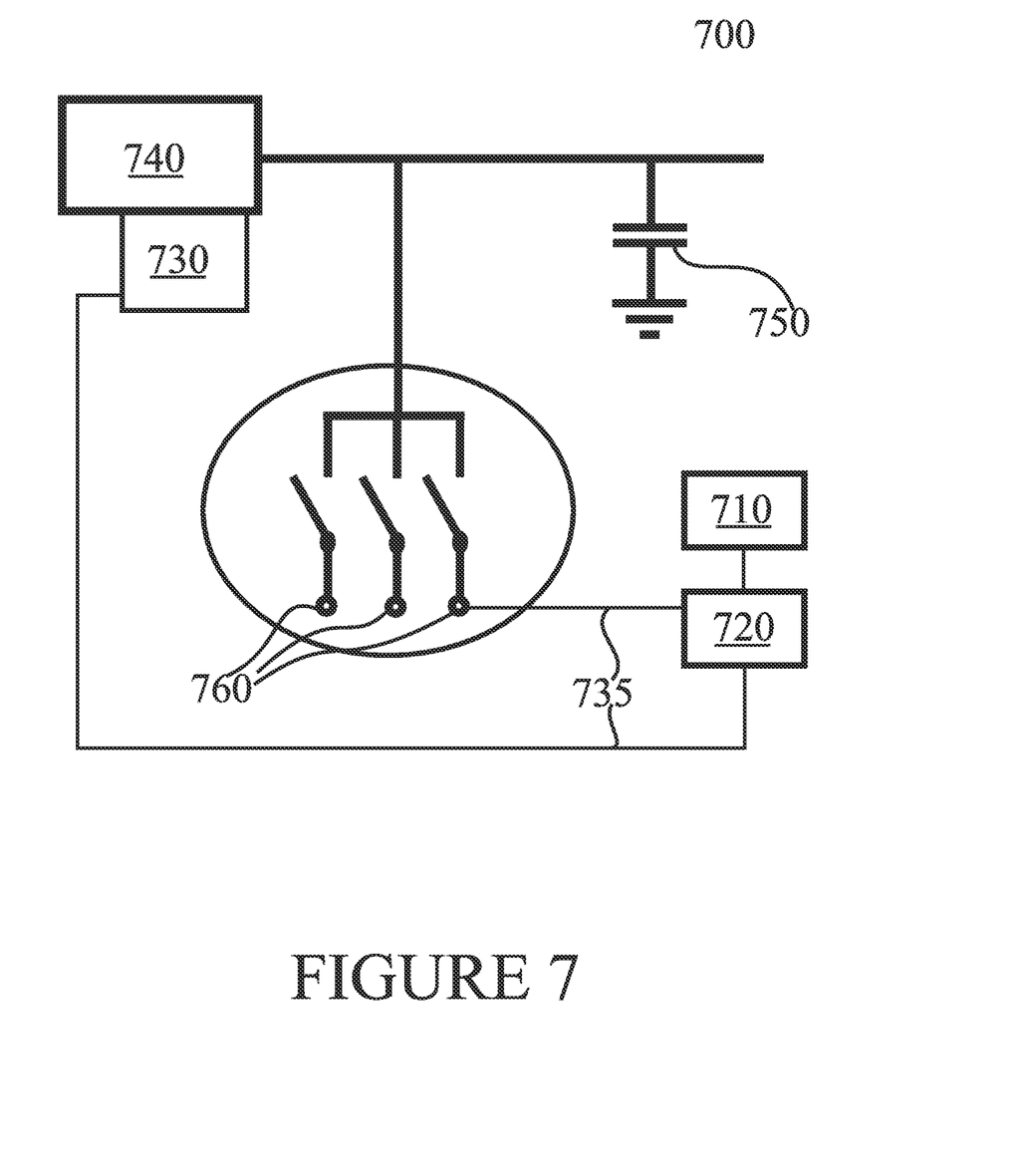
FIG. 7 illustrated use of a programmable current source and memory in a detector circuit in accordance with at least some embodiments of the present invention.

FIG. 7 also illustrates an imaging system. The illustrated imaging system 700 comprises a memory 710, a processing core 720, and a temperature sensor 730, as illustrated. Further, imaging system 700 comprises a detector substrate 740, at least one capacitor 750 and at least one programmable current source 760, arranged to provide a neutralizing charge to the capacitor, wherein imaging system 700 is configured to select a value for the neutralizing charge as described herein above. The illustrated components may be interconnected in a suitable manner using electrical connecting leads 735 or communication buses, to enable processing core 720 to program the at least one programmable current source 760 to provide to capacitor 750 the neutralizing charge to at least in part cancel out a charge carried into capacitor 750 by a dark current.

Figure 8:
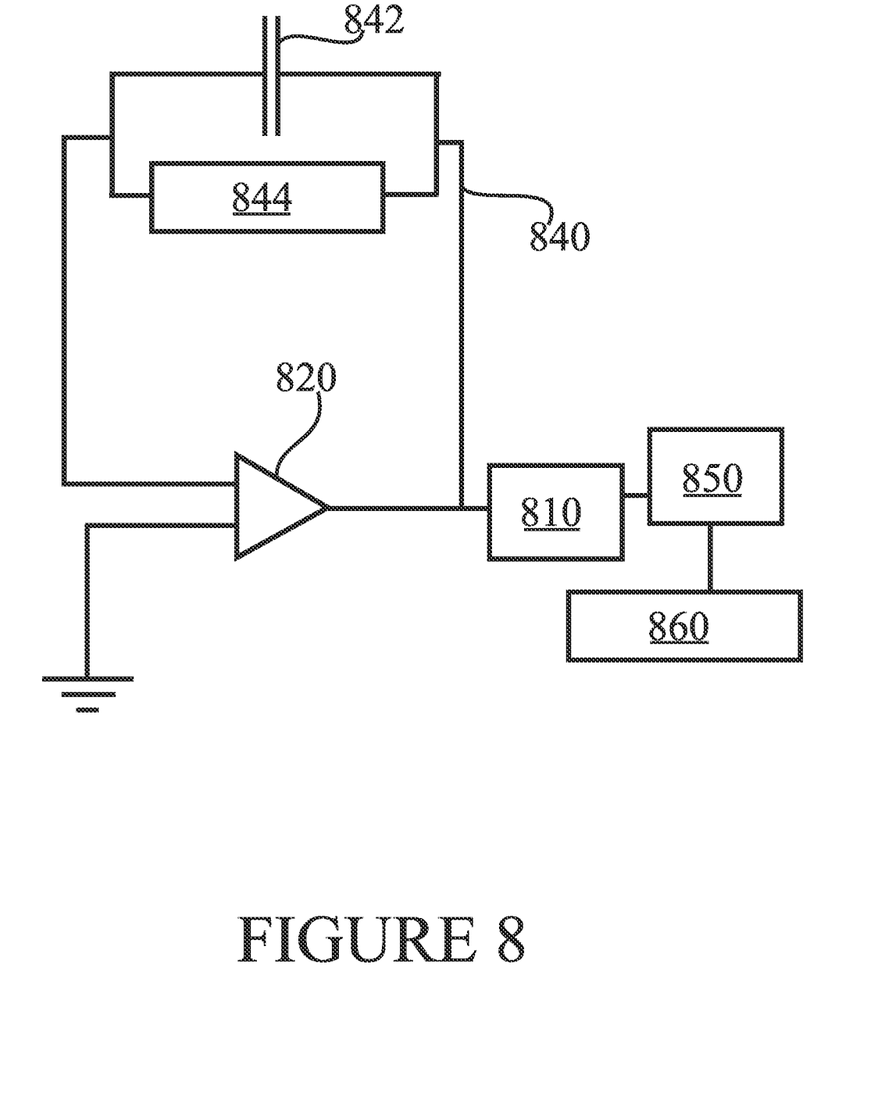
FIG. 8 illustrates a feedback loop over an amplifier.

FIG. 8 illustrates a feedback loop over an amplifier, which in not used in at least some of the described embodiments. In the arrangement of FIG. 8, an amplifier 820 is disposed before a pulse shaper 810 and a discrimination and counter unit 850, as illustrated, with a feedback loop 840 connected over amplifier 820 to control, partly, the effects of dark currents. Amplifier 820 is also connected to ground, as illustrated The feedback loop of FIG. 8 comprises, as illustrated, a capacitor 842 and a continuous reset unit 844 connected in parallel. Discrimination and counter unit 850 may be used in reading out a detector substrate, for example. A threshold 860 may be provided to the discrimination and counter unit 850. In at least some embodiments of the present disclosure, a feedback loop over an amplifier is not used, and one benefit of at least some disclosed embodiments is that this feedback loop is not needed.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to one embodiment or an embodiment means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. Where reference is made to a numerical value using a term such as, for example, about or substantially, the exact numerical value is also disclosed.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the preceding description, numerous specific details are provided, such as examples of lengths, widths, shapes, etc., to provide a thorough understanding of embodiments of the invention, One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", that is, a singular form, throughout this document does not exclude a plurality.

INDUSTRIAL APPLICABILITY

At least some embodiments of the present invention find industrial application in digital imaging.

| REFERENCE SIGNS LIST | |
|---|---|
| 101 | incident radiation |
| 110, 740 | detector substrate |
| 120 | processing device |
| 130 | image |
| 132 | object |
| 140 | detector circuit |
| 112 | bias voltage |
| 114 | surface current |
| 116 | pixels |
| 118 | guard ring |
| 210, 760 | at least one programmable current source |
| 212 | current source |
| 214, 230 | switch |
| 220, 750, 842 | capacitor |
| 410-420, #1, #2, #N | Phases of the process of FIG. 4 |
| 510-520 | Phases of the method of FIG. 5 |
| 697 | field lines |
| 698 | defect |

-continued

REFERENCE SIGNS LIST

| | |
|---|---|
| 699 | charges |
| 700 | imaging system |
| 710 | memory |
| 720 | processing core |
| 730 | temperature sensor |
| 735 | electrically connecting leads |
| 840 | feedback loop |
| 844 | continuous reset unit |
| 820 | amplifier |
| 860 | threshold providing unit |
| 810 | pulse shaper |

The invention claimed is:

1. An imaging system comprising:
a detector substrate;
at least one detector circuit comprising a capacitor coupled with the detector substrate, the capacitor arranged to collect an electrical charge from the detector substrate;
at least one programmable current source, arranged to provide a neutralizing charge to the capacitor; and
a processing core configured to select a value for the neutralizing charge in dependence of a frame number and program the at least one programmable current source based on the value.

2. The imaging system in accordance with claim 1, wherein the detector substrate comprises a semiconductor substrate such as: a CdTe substrate, a GaAs substrate, a Si substrate, a $HgI_2$, or a Se substrate.

3. The imaging system according to claim 1, wherein the at least one programmable current source is configured to provide the neutralizing charge to the capacitor separately for each pixel or group of pixels.

4. The imaging system according to claim 1, wherein the imaging system is configured to select a value for the neutralizing charge separately for each pixel, or separately for each group of pixels.

5. The imaging system according to claim 1, wherein the imaging system is configured to select a value for the neutralizing charge in dependence of a temperature of the detector substrate.

6. The imaging system according to claim 1, wherein the imaging system is configured to select a value for the neutralizing charge in dependence of at least one of: a current incident radiation dose and a cumulative incident radiation dose.

7. The imaging system according to claim 1, wherein the at least one programmable current source is configured to provide the neutralizing charge during a part of a charge collection time of a frame, but not during the entire charge collection time of a frame.

8. The imaging system according to claim 7, wherein the at least one programmable current source is configured to provide the neutralizing charge during at most two thirds of the charge collection time of a frame.

9. The imaging system according to claim 7, wherein the at least one programmable current source is configured to provide the neutralizing charge during at most one half of the charge collection time of a frame.

10. The imaging system according to claim 7, wherein the at least one programmable current source is configured to provide the neutralizing charge during at most one third of the charge collection time of a frame.

11. The imaging system according to claim 1, wherein the detector circuit does not comprise a feedback loop over an amplifier.

12. The imaging system in accordance with claim 1, comprising plural detector circuits, each of the plural detector circuits comprising at least one capacitor and arranged to receive the neutralizing charge from the at least one programmable current source.

13. The imaging system according to claim 1, comprising circuitry configured to generate a biasing voltage across at least part of the detector substrate.

14. The imaging system according to claim 1, wherein the at least one programmable current source is comprised inside the detector circuit.

15. The imaging system according to claim 1, wherein the imaging system further comprises memory configured to store information enabling the neutralizing charge to be defined for each pixel and frame number.

16. The imaging system according to claim 1, wherein the imaging system further comprises at least one temperature sensor configured to measure a temperature of the detector substrate.

17. A method in a detector circuit, comprising:
collecting, in a capacitor coupled with a detector substrate of the detector circuit, an electrical charge from the detector substrate;
providing a neutralizing charge to the capacitor from at least one programmable current source;
selecting a value for the neutralizing charge in dependence of a frame number; and
programming the at least one programmable current source based on the value.

18. The method in accordance with claim 17, wherein the detector substrate comprises a semiconductor substrate such as: a CdTe substrate, a GaAs substrate, a Si substrate, a $HgI_2$ or a Se substrate.

19. The method according to claim 17, wherein the at least one programmable current source provides the neutralizing charge to the capacitor separately for each pixel or group of pixels.

20. The method according to claim 17, further comprising selecting a value for the neutralizing charge separately for each pixel, or separately for each group of pixels.

21. The method according to claim 17, further comprising generating a biasing voltage across at least part of the detector substrate.

22. The method according to claim 17, further comprising providing, by the at least one programmable current source, the neutralizing charge during a part of a charge collection time of a frame, but not during the entire charge collection time of a frame.

23. The method in accordance with claim 17, wherein the at least one programmable current provides the neutralizing charge during at most two thirds of the charge collection time of a frame.

24. The method according to claim 17, wherein the detector circuit does not comprise a feedback loop over an amplifier.

25. The method according to claim 17, wherein the method comprises using plural detector circuits as part of an imaging system, the imaging system further comprising the detector substrate.

26. A non-transitory computer readable medium having stored thereon a set of computer readable instructions that, when executed by at least one processor, cause an imaging system to at least:

collect, in a capacitor comprised in a detector circuit of the imaging system, an electrical charge from a detector substrate;
provide a neutralizing charge to the capacitor from at least one programmable current source;
select a value for the neutralizing charge in dependence of a frame number; and
program the at least one programmable current source based on the value.

* * * * *